United States Patent
Komatsu et al.

(10) Patent No.: US 9,599,892 B2
(45) Date of Patent: Mar. 21, 2017

(54) COMPOSITION FOR PATTERN FORMATION, AND PATTERN-FORMING METHOD

(71) Applicant: JSR CORPORATION, Tokyo (JP)

(72) Inventors: Hiroyuki Komatsu, Tokyo (JP); Takehiko Naruoka, Tokyo (JP); Shinya Minegishi, Tokyo (JP); Tomoki Nagai, Tokyo (JP)

(73) Assignee: JSR CORPORATION, Tokyo (JP)

( * ) Notice: Subject to any disclaimer, the term of this patent is extended or adjusted under 35 U.S.C. 154(b) by 1 day.

(21) Appl. No.: 14/668,335

(22) Filed: Mar. 25, 2015

(65) Prior Publication Data

US 2015/0277223 A1 Oct. 1, 2015

(30) Foreign Application Priority Data

Mar. 28, 2014 (JP) ................. 2014-070198

(51) Int. Cl.
| | |
|---|---|
| *G03F 7/00* | (2006.01) |
| *G03F 7/20* | (2006.01) |
| *G03F 7/38* | (2006.01) |
| *G03F 7/40* | (2006.01) |
| *G03F 7/36* | (2006.01) |
| *H01L 21/027* | (2006.01) |
| *G03F 7/32* | (2006.01) |

(Continued)

(52) U.S. Cl.
CPC ........ *G03F 7/0002* (2013.01); *C08F 297/026* (2013.01); *C08K 5/42* (2013.01); *G03F 7/0035* (2013.01); *G03F 7/2041* (2013.01); *G03F 7/322* (2013.01); *G03F 7/36* (2013.01); *G03F 7/38* (2013.01); *G03F 7/40* (2013.01); *H01L 21/0271* (2013.01); *H01L 21/0274* (2013.01); *H01L 21/31133* (2013.01); *H01L 21/31138* (2013.01); *C08L 53/00* (2013.01)

(58) Field of Classification Search
None
See application file for complete search history.

(56) References Cited

U.S. PATENT DOCUMENTS

| | | | |
|---|---|---|---|
| 2001/0024684 A1 | 9/2001 | Steiner et al. | |
| 2014/0238956 A1* | 8/2014 | Namie ................ | H01L 21/0337 216/83 |
| 2015/0093508 A1* | 4/2015 | Nagai .................... | B82Y 40/00 427/271 |

FOREIGN PATENT DOCUMENTS

| | | |
|---|---|---|
| JP | 2002-519728 A | 7/2002 |
| JP | 2003-218383 A | 7/2003 |

(Continued)

OTHER PUBLICATIONS

U.S. Appl. No. 14/691,043, filed Apr. 20, 2015, Komatsu, et al.
U.S. Appl. No. 14/620,935, filed Feb. 12, 2015, Komatsu, et al.

*Primary Examiner* — Sin Lee
(74) *Attorney, Agent, or Firm* — Oblon, McClelland, Maier & Neustadt, L.L.P.

(57) ABSTRACT

A composition for pattern formation includes a block copolymer and a solvent. The block copolymer includes a group including a reactive group on at least one end of a main chain of the block copolymer. A pattern-forming method includes providing a directed self-assembling film directly or indirectly on a substrate using the composition. The directed self-assembling film includes a phase separation structure which includes a plurality of phases. A part of the plurality of phases of the directed self-assembling film is removed.

17 Claims, 3 Drawing Sheets

(51) Int. Cl.
    *C08K 5/42*           (2006.01)
    *H01L 21/311*       (2006.01)
    *C08F 297/02*      (2006.01)
    *C08L 53/00*        (2006.01)

(56) References Cited

FOREIGN PATENT DOCUMENTS

| | | |
|---|---|---|
| JP | 2008-149447 A | 7/2008 |
| WO | WO 2013/069544 A1 * | 5/2013 |
| WO | WO 2014/003023 A1 * | 1/2014 |

\* cited by examiner

COMPOSITION FOR PATTERN FORMATION, AND PATTERN-FORMING METHOD

CROSS-REFERENCE TO RELATED APPLICATIONS

The present application claims priority to Japanese Patent Application No. 2014-070198, filed Mar. 28, 2014. The contents of this application are incorporated herein by reference in their entirety.

BACKGROUND OF THE INVENTION

Field of the Invention

The present invention relates to a composition for pattern formation and a pattern-forming method.

Discussion of the Background

Miniaturization of various types of electronic device structures such as semiconductor devices and liquid crystal devices has been accompanied by demands for microfabrication of patterns in lithography processes. In these days, although fine patterns having a line width of about 90 nm can be formed using, for example, an ArF excimer laser beam, further finer pattern formation has been required.

To meet the demands described above, some pattern-forming methods which utilize a phase separation structure constructed through directed self-assembly, as generally referred to, that spontaneously forms an ordered pattern have been proposed. For example, an ultrafine pattern-forming method by directed self-assembly has been known in which a block copolymer obtained by copolymerizing: a monomer compound having one property; and a monomer compound having a property that is distinct from the one property is involved (see Japanese Unexamined Patent Application, Publication No. 2008-149447, Japanese Unexamined Patent Application (Translation of PCT Application), Publication No. 2002-519728, and Japanese Unexamined Patent Application, Publication No. 2003-218383). According to this method, annealing of a film formed from a composition containing the block copolymer results in a tendency of clustering of polymer structures having the same property, and thus a pattern can be formed in a self-aligning manner.

SUMMARY OF THE INVENTION

According to one aspect of the present invention, a composition for pattern formation includes a block copolymer and a solvent. The block copolymer includes a group including a reactive group on at least one end of a main chain of the block copolymer.

According to another aspect of the present invention, a pattern-forming method includes providing a directed self-assembling film directly or indirectly on a substrate using the composition. The directed self-assembling film includes a phase separation structure which includes a plurality of phases. A part of the plurality of phases of the directed self-assembling film is removed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE PREFERRED EMBODIMENTS

Figure 1:
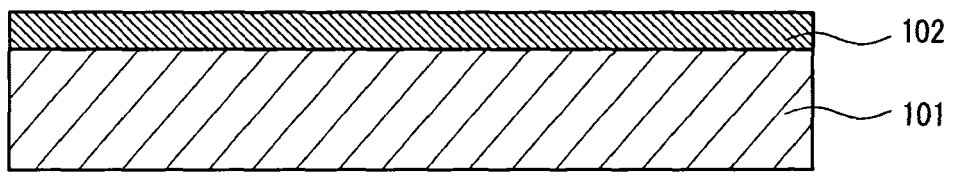
FIG. 1 shows a schematic cross sectional view illustrating one example of a state after providing an underlayer film on a substrate in an pattern-forming method according to an embodiment of the present invention.

According to an embodiment of the invention made for solving the aforementioned problems, a composition for pattern formation contains: a block copolymer (hereinafter, may be also referred to as "(A) block copolymer" or "block copolymer (A)"); and a solvent (hereinafter, may be also referred to as "(B) solvent" or "solvent (B)"), in which the block copolymer includes a group having a reactive group (hereinafter, may be also referred to as "group (a)") on at least one end of the main chain thereof.

According to another embodiment of the invention made for solving the aforementioned problems, a pattern-forming method includes: providing a directed self-assembling film directly or indirectly on a substrate using the composition for pattern formation, the directed self-assembling film having a phase separation structure; and removing a part of a plurality of phases of the directed self-assembling film.

The "directed self assembly" or "directed self-assembling" as referred to herein means a phenomenon of spontaneously constructing a tissue or a structure without resulting from only the control from an external factor. The "main chain" as referred to herein means the longest linking chain in a block copolymer.

The composition for pattern formation and the pattern-forming method according to the embodiments of the present invention are superior in inhibitory ability of defects in the phase separation structure, rectangularity of the cross-sectional shape of the pattern configuration, (i.e. tailing is effectively prevented) and etching resistance. Therefore, these can be suitably used for pattern formation in manufacture of semiconductor devices, and the like in which further progress of miniaturization is expected in the future.

Hereinafter, embodiments of the composition for pattern formation and the pattern-forming method according to the present invention are explained in detail.

Composition for Pattern Formation

A composition for pattern formation according to an embodiment of the present invention contains the block copolymer (A) and the solvent (B). In addition, the composition for pattern formation may further contain as a favorable component, (C) a reaction accelerator or (D) a crosslinkable compound, and may also contain other optional component(s), in addition to the aforementioned components, within a range not leading to impairment of the effects of the present invention.

(A) Block Copolymer

The block copolymer (A) includes (a) a group having a reactive group on at least one end of the main chain thereof. Although not necessarily clarified, the reason for achieving the effects described above resulting from the composition for pattern formation having the aforementioned constitution is presumed to be as in the following, for example. Specifically, due to the block copolymer (A) having the reactive group on the end of the main chain thereof, the molecules of the block copolymer (A) would be crosslinked at the ends with each other by way of the reactive group in forming the directed self-assembling film, and crosslinking would also occur between the block polymer (A) and the prepattern and/or the like. Thus, it is considered that phase separation of the block copolymer (A) is more favorably caused, and consequently, the defects of the structure are suppressed, whereby rectangularity of the cross-sectional shape of the pattern and etching resistance of the directed self-assembling film may be improved.

A plurality of blocks constituting the block copolymer (A) are composed of each distinct repeating unit. More specifically, each block has a chain structure of units derived from one kind of monomer, and the monomers constituting each block are different from each other. When the block copolymer (A) including such a plurality of blocks is dissolved in an appropriate solvent, the same kind of blocks are aggregated, and thus phases each configured with the same type of the block are formed. In this process, it is presumed that a phase separation structure having an ordered pattern in which different types of phases are periodically and alternately repeated can be formed since the phases formed with different types of the blocks are unlikely to be admixed with each other.

The block is exemplified by a poly((meth)acrylic acid ester) block, a polystyryl derivative block, a (meth)acryl block other than (the) poly((meth)acrylic acid ester) block, a polyvinyl acetal block, a polyurethane block, a polyurea block, a polyimide block, a polyamide block, an epoxy block, a novolak-type phenol block, a polyester block, and the like.

The plurality of blocks preferably include a poly((meth)acrylic acid ester) block, and it is more preferred that a polystyryl derivative block is further included. Also, it is even more preferred that the plurality of blocks include only the poly((meth)acrylic acid ester) block and the polystyryl derivative block. When the blocks in the block copolymer (A) include a combination of the poly((meth)acrylic acid ester) block and the polystyryl derivative block, phase separation of the composition for pattern formation is further facilitated.

Examples of the styryl derivative include styrene, methylstyrene, t-butylstyrene, trimethylstyrene, methoxystyrene, t-butoxystyrene, chloromethylstyrene, halogenated styrene, nitrostyrene, cyanovinylbenzene, and the like.

The block copolymer (A) is exemplified by a diblock polymer, a triblock polymer, a tetrablock polymer, and the like. Of these, a diblock polymer and a triblock polymer are preferred. In addition, when the block copolymer (A) is a triblock polymer, it is preferred that only two kinds of blocks are involved. When the block copolymer (A) has the structure described above, phase separation is further facilitated, and the inhibitory ability of defects of the composition for pattern formation is further improved.

Group (a)

The group (a) has the reactive group. Due to the reactive group, a crosslinking reaction is caused during forming the directed self-assembling film.

It is to be noted that the "reactive group" as referred to herein means a functional group that causes addition polymerization, chain polymerization, sequential polymerization, a condensation reaction, etc., by using an external stimulation such as heat and light, or a substance that plays an auxiliary role such as a catalyst.

Examples of the reactive group include:

ethylenic carbon-carbon double bond-containing groups such as a vinyl group, a vinyl ether group, an acryl group, a methacryl group;

carbon-carbon triple bond-containing groups such as a propargylamino group, an ethynylanilyl group, a phenylethynylanilyl group and a phenylethynylphthalic anhydride group, cyclic ether groups such as an oxiranyl group, an oxetanyl group and an oxolanyl group;

active hydrogen-containing groups such as a silanol group, a thiol group, a hydroxy group and an amino group;

cyclic thiol groups, a methylol group, and an alkoxymethyl group; and the like. Of these, ethylenic carbon-carbon double bond-containing groups, carbon-carbon triple bond-containing groups, an oxiranyl group and an oxetanyl group are preferred, and a vinyl group, a vinyl ether group, an oxiranyl group and an oxetanyl group are more preferred.

The group (a) is exemplified by groups obtained by binding the reaction group described above to a divalent organic group, and the like.

The divalent organic group is exemplified by divalent hydrocarbon groups, groups having a hetero atom-containing group between two carbon atoms of the hydrocarbon groups, groups obtained by substituting a part or all of hydrogen atoms of these groups with a substituent, and the like.

Examples of the divalent hydrocarbon group include:

chain hydrocarbon groups involving e.g., alkanediyl groups such as a methanediyl group, an ethanediyl group, a propanediyl group and a butanediyl group;

alkenediyl groups such as an ethenediyl group, a propenediyl group and a butenediyl group; and alkynediyl groups such as an ethynediyl group, a propynediyl group and a butynediyl group;

alicyclic hydrocarbon groups involving e.g., monocyclic cycloalkanediyl groups such as a cyclopropanediyl group, a cyclobutanediyl group, a cyclopentanediyl group and a cyclohexanediyl group;

monocyclic cycloalkenediyl groups such as a cyclopropenediyl group and a cyclobutenediyl group;

polycyclic cycloalkanediyl groups such as a norbornanediyl group, an adamantanediyl group, a tricyclodecanediyl group and a tetracyclododecanediyl group; and polycyclic cycloalkenediyl groups such as a norbornenediyl group and a tricyclodecenediyl group;

aromatic hydrocarbon groups involving e.g., arenediyl groups such as a benzenediyl group, a toluenediyl group, a xylene diyl group and a naphthalenediyl group; and arenediyl(cyclo)alkanediyl groups such as a benzenediylmethanediyl group and a naphthalenediylcyclohexanediyl group.

The hetero atom-containing groups as referred to means groups having a divalent or multivalent hetero atom in the structure thereof. The hetero atom-containing group may have one, or two or more hetero atoms.

The divalent or multivalent hetero atom included in the hetero atom-containing group is not particularly limit as long as it is a hetero atom having an atomic valence of two or more, and examples of the divalent or multivalent hetero atom include an oxygen atom, a nitrogen atom, a sulfur atom, a silicon atom, a phosphorus atom, a boron atom, and the like.

The hetero atom-containing group is exemplified by:

groups obtained by combining two or more hetero atoms such as —SO—, —SO$_2$—, —SO$_2$O— and —SO$_3$—;

groups obtained by combining a carbon atom and any one of hetero atoms such as —CO—, —COO—, —COS—, —CONH—, —OCOO—, —OCOS—, —OCONH—, —SCONH—, —SCSNH— and —SCSS—; and the like.

Examples of the substituent include a halogen atom, a hydroxy group, a carboxy group, a nitro group, a cyano group, and the like.

The block copolymer (A) may include the group (a) on either only one end or both two ends of the main chain thereof, and preferably include on only one end. When the block copolymer (A) thus includes the group (a) on only one end of the main chain thereof, it is considered that each polymer constituting the block copolymer (A) can be more efficiently arranged, and the inhibitory ability of defects of the phase structure formed is further improved.

Production Method of Block Copolymer (A)

The block copolymer (A) is obtained by using (X) a compound having a reactive group and a carbon-halogen bond, as a polymerization terminator of block copolymerization. More specifically, by carrying out the block copolymerization, and terminating the polymerization through allowing the compound (X) to react with the polymerization end, a product in which a group derived from the compound (X) bonds to the end of the block copolymer is obtained.

The block copolymer (A) may be synthesized through living anionic polymerization, living radical polymerization or the like. Of these, living anionic polymerization arbitrary which enables the end structure to be easily introduced is more preferred. For example, the block copolymer (A) may be synthesized by linking while polymerizing the polystyrene block, a polymethyl methacrylate block and the other block(s) in a desired order, and terminating the polymerization end by the compound (X) to introduce the group (a) to the end.

For example, in a case where the block copolymer (A) that is a diblock copolymer constituted with the polystyrene block and the polymethyl methacrylate block is to be synthesized, styrene is polymerized first using an anion polymerization initiator in an appropriate solvent to synthesize a polystyrene block. Next, a polymethyl methacrylate block is similarly synthesized by polymerizing methyl methacrylate so as to link to the polystyrene block. Thereafter, by subjecting to a treatment with the compound (X) such as 4-vinylbenzyl chloride, the group (a) can be introduced to the end of the main chain of the polymethyl methacrylate block. It is to be noted that in regard to the polymerization method of the block copolymerization, for example, the synthesis can be executed by a process including e.g., adding a solution containing a monomer dropwise into a reaction solvent containing an initiator to permit a polymerization reaction.

Examples of the solvent for use in the polymerization include:

alkanes such as n-pentane, n-hexane, n-heptane, n-octane, n-nonane and n-decane;

cycloalkanes such as cyclohexane, cycloheptane, cyclooctane, decalin and norbornane;

aromatic hydrocarbons such as benzene, toluene, xylene, ethylbenzene and cumene;

halogenated hydrocarbons such as chlorobutanes, bromohexanes, dichloroethanes, hexamethylene dibromide and chlorobenzene;

saturated carboxylic acid esters such as ethyl acetate, n-butyl acetate, i-butyl acetate and methyl propionate;

ketones such as acetone, 2-butanone, 4-methyl-2-pentanone and 2-heptanone;

ethers such as tetrahydrofuran, dimethoxyethanes and diethoxyethanes; and the like. These solvents may be used either alone, or two or more types thereof may be used in combination.

The reaction temperature in the polymerization may be predetermined ad libitum depending on the type of the initiator, and is typically −150° C. to 50° C. and preferably −80° C. to 40° C. The reaction time period is typically 5 min to 24 hrs, and preferably 20 min to 12 hrs.

Examples of the initiator for use in the polymerization include alkyllithiums, alkylmagnesium halides, naphthalene sodium, alkylated lanthanoid compounds, and the like. Of these, an alkyllithium compound is preferably used in a case where the polymerization is carried out using styrene or methyl methacrylate as a monomer.

In regard to the method for terminating the polymerization using the polymerization terminator, for example a method following the scheme below, and the like may be exemplified. More specifically, the compound (X) such as 4-vinylbenzyl chloride is added to the polymerization end of the block copolymerization to terminate the polymerization, and the end of the main chain is degenerated, followed by subjecting to a demetallation treatment with an acid, or the like, whereby the block copolymer (A) that includes the group (a) at the end is obtained.

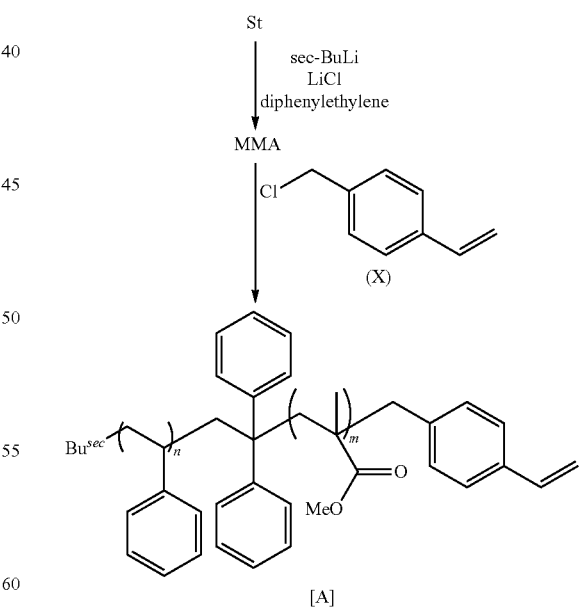

In the above scheme, n and m are an integer 10 to 5,000.

The compound (X) is exemplified by compounds in which the group (a) bonds to a halogen atom, and the like. The halogen atom is preferably a chlorine atom and a bromine atom.

The compound (X) is preferably chlorine-containing alkylvinylbenzene, chlorine-containing alkyl vinyl ether, chlorine-containing olefin, bromine-containing olefin and chlorine-containing alkyloxetane, and more preferably 4-vinylbenzyl chloride, chloroethyl vinyl ether, allyl bromide and 3-ethyl-3-chloromethyloxetane.

The block copolymer (A) subjected to the end treatment is preferably recovered through a reprecipitation procedure. More specifically, after completion of the end treatment reaction, the intended copolymer is recovered in the form of a powder through charging the reaction liquid into a reprecipitation solvent. As the reprecipitation solvent, an alcohol, an alkane and the like may be used either alone or as a mixture of two or more types thereof. Alternative to or in addition to the reprecipitation procedure, a liquid separating operation, a column operation, an ultrafiltration operation or the like also enables the polymer to be recovered through eliminating low molecular components such as monomers and oligomers.

The weight average molecular weight (Mw) of the block copolymer (A) as determined by gel permeation chromatography (GPC) is preferably 1,000 to 150,000, more preferably 1,500 to 120,000, and still more preferably 2,000 to 100,000. When the Mw of the block copolymer (A) falls within such a specific range, the composition for pattern formation exhibits reduced defects in the phase separation structure, and rectangularity of the cross-sectional shape of the pattern configuration and etching resistance are further improved.

The ratio (Mw/Mn) of the Mw to the number average molecular weight (Mn) of the block copolymer (A) is typically 1 to 5, preferably 1 to 3, more preferably 1 to 2, still more preferably 1 to 1.5, and particularly preferably 1 to 1.2. When the Mw/Mn falls within such a specific range, the composition for pattern formation enables a pattern that is finer and has a favorable microdomain structure to be formed.

It is to be noted that the Mw and the Mn are determined by gel permeation chromatography (GPC) using GPC columns ("G2000 HXL"×2, "G3000 HXL"×1 and "G4000 HXL"×1; all manufactured by Tosoh Corporation), a differential refractometer as a detector, and mono-dispersed polystyrene as a standard, under the analytical condition involving: flow rate of 1.0 mL/min; an elution solvent of tetrahydrofuran; a sample concentration of 1.0% by mass; an amount of the sample injected of 100 μL; and a column temperature of 40° C.

(B) Solvent

The composition for pattern formation contains the solvent (B). The solvent (B) is exemplified by solvents similar to those exemplified in connection with the synthesis method of the block copolymer (A). Of these, propylene glycol monomethyl ether acetate is preferred. It is to be noted that these solvents may be used alone, or two or more types thereof may be used in combination.

(C) Reaction Accelerator

The reaction accelerator (C) is a substance having a catalytic action that promotes the reaction of the reactive group. It is preferred that the composition for pattern formation contains the reaction accelerator (C). Due to the presence of the reaction accelerator (C), a crosslinking reaction is promoted between the molecules of block copolymer (A) in the directed self-assembling film, and between the directed self-assembling film and the prepattern and the like; therefore, the etching resistance of the formed pattern is further improved. The reaction accelerator (C) is exemplified by acidic compounds, acid generators, and the like.

The acidic compound is exemplified by organic acids and inorganic acids. Examples of the organic acid include acetic acid, propionic acid, butanoic acid, pentanoic acid, hexanoic acid, heptanoic acid, octanoic acid, nonanoic acid, decanoic acid, oxalic acid, maleic acid, maleic anhydride, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, methanesulfonic acid, phthalic acid, fumaric acid, citric acid, tartaric acid, and the like. Examples of the inorganic acid include hydrochloric acid, nitric acid, sulfuric acid, hydrofluoric acid, phosphoric acid, and the like.

The acid generator is a compound that generates an acid by light, heat or the like. The acid generator that generates an acid by light is exemplified by an onium salt compound, an N-sulfonyloxyimide compound, a halogen-containing compound, a diazo ketone compound, and the like. Examples of the onium salt compound include sulfonium salts, iodonium salts, tetrahydrothiophenium salts, phosphonium salts, diazonium salts, pyridinium salts, and the like. The acid generator that generates an acid by heat is exemplified by 2,4,4,6-tetrabromocyclohexadienone, benzoin tosylate, 2-nitrobenzyl tosylate, alkylsulfonates, and the like.

Among these, the acid generator is preferably an onium salt compound, more preferably a sulfonium salt and a tetrahydrothiophenium salt, still more preferably a sulfonium salt having an alicyclic structure, and particularly preferably triphenylsulfonium 2-(norbornan-2-yl)-1,1,2,2-tetrafluoroethane-1-sulfonate.

The content of the reaction accelerator (C) is preferably no less than 20 parts by mass and no greater than 70 parts by mass, and more preferably no less than 30 parts by mass and no greater than 60 parts by mass with respect to 100 parts by mass of the block copolymer (A), in light of more appropriate etching resistance and the like of the directed self-assembling film formed. When the content of the acid generator (C) falls within the above range, the etching resistance of the pattern formed from the composition for pattern formation is further improved. The acid generator (C) may be used either alone or two or more types may be used in combination.

(D) Crosslinkable Compound

The crosslinkable compound (D) as referred to means a compound having two or more reactive functional groups. It is preferred that the composition for pattern formation contains the crosslinkable compound (D). Due to the presence of the crosslinkable compound (D), the degree of crosslinking is elevated between the molecules of block copolymer (A) in the directed self-assembling film, and between the directed self-assembling film and the prepattern and the like; therefore, the etching resistance of the formed pattern is further improved.

The reactive functional group is exemplified by groups similar to the reactive groups in connection with the block copolymer (A), and the like. Of these, a vinyl group, a vinyl ether group, an oxiranyl group, an oxetanyl group, a silanol group and a thiol group are preferred. Two reactive groups included in the crosslinkable compound (D) may be the same or different.

In addition, the crosslinkable compound (D) preferably has an organic group in addition to the reactive functional group. The organic group is exemplified by groups similar to those exemplified in connection with the block copolymer (A), and the like. Of these, an alkyl group is preferred, an alkyl group having 2 to 10 carbon atoms is more preferred, and an alkyl group having 3 to 6 carbon atoms is even more preferred.

Surfactant

The composition for pattern formation may further contain a surfactant. When the composition for pattern formation contains the surfactant, coating properties to the substrate and the like can be improved.

Preparation Method of Composition for Pattern Formation

The composition for pattern formation may be prepared, for example, by mixing the block copolymer (A), the surfactant and the like at a certain ratio in the solvent (B). Alternatively, the composition for pattern formation may be prepared in a state which has been dissolved or dispersed in an appropriate solvent, and may be put the solution into use.

Pattern-Forming Method

The pattern-forming method according to the embodiment of the present invention includes: the step of providing a directed self-assembling film having a phase separation structure on a substrate using the composition for pattern formation of embodiment of the present invention (hereinafter, may be also referred to as "directed self-assembling film-providing step"); and the step of removing a part of a plurality of phases of the directed self-assembling film (hereinafter, may be also referred to as "removing step"). In addition, it is preferred that the pattern-forming method further includes heating during or after the directed self-assembling film-providing step. The heating allows a crosslinking reaction of the block copolymer (A) to be further promoted.

Moreover, it is preferred that before the directed self-assembling film-providing step, the pattern-forming method further includes: the step of providing an underlayer film on the substrate (hereinafter, may be also referred to as "underlayer film-providing step"); and the step of forming a prepattern on the underlayer film (hereinafter, may be also referred to as "prepattern-forming step"), and that in the directed self-assembling film-providing step, the directed self-assembling film is provided on a region of the underlayer film compartmentalized by the prepattern, and that after the directed self-assembling film-providing step, the pattern-forming method further includes the step of removing the prepattern (hereinafter, may be also referred to as "prepattern-removing step").

Even more, it is preferred that after the removing step, the pattern-forming method further includes the step of etching the substrate using the pattern formed above as a mask (hereinafter, may be also referred to as "substrate pattern-forming step"). Each step will be described in detail below. It is to be noted that each step will be explained with reference to FIGS. 1 to 5 by way of an example in which the first block (a1) is a polystyryl derivative block, and the second block (a2) is a poly((meth)acrylic acid ester) block.

Underlayer Film-Forming Step

In this step, an underlayer film is provided on a substrate using a composition for forming an underlayer film. Thus, as shown in FIG. 1, a substrate having an underlayer film can be obtained which includes an underlayer film 102 provided on a substrate 101, and the directed self-assembling film is provided on the underlayer film 102. The phase separation structure (microdomain structure) included in the directed self-assembling film is altered by not only an interaction between each of the blocks of the block copolymer (A) contained in the composition for pattern formation, but also an interaction with the underlayer film 102; therefore, the structure may be easily controlled by virtue of having the underlayer film 102, whereby a desired pattern can be obtained. Furthermore, when the directed self-assembling film is thin, a transfer process thereof can be improved owing to having the underlayer film 102.

As the substrate 101, for example, a conventionally well-known substrate, e.g., a silicon wafer, a wafer coated with aluminum, or the like may be used.

As the composition for forming an underlayer film, a conventionally well-known organic material for forming an underlayer film may be used. In addition, it is preferred that the underlayer film has on the surface thereof, (b) a group capable of reacting with the reactive group included in the group (a). When the underlayer film thus has the group (b), a crosslinking reaction is caused between the directed self-assembling film provided by the composition for pattern formation, and the underlayer film, whereby binding between the directed self-assembling film and the underlayer film is further strengthened. As a result, etching resistance of the pattern obtained from the directed self-assembling film is further improved.

The group (b) is exemplified by groups similar to the reactive groups which may be included in the block copolymer (A), and the like.

Although the procedure for providing the underlayer film 102 is not particularly limited, the underlayer film 102 may be formed by, for example, curing a coating film through exposing and/or heating, which had been provided by an application according to a well-known method such as a spin coating method on the substrate 101. Examples of the radioactive ray which may be employed for the exposure include visible light rays, ultraviolet rays, far ultraviolet rays, X-rays, electron beams, γ-rays, molecular beams, ion beams, and the like. Moreover, the temperature employed during heating the coating film is not particularly limited, and is preferably 90° C. to 550° C., more preferably 90° C. to 450° C., and still more preferably 90° C. to 300° C. Also, the film thickness of the underlayer film 102 is not particularly limited, and is preferably 50 nm to 20,000 nm, and more preferably 70 nm to 1,000 nm. In addition, the underlayer film 102 preferably includes an SOC (Spin on carbon) film.

Prepattern-Forming Step

Figure 2:
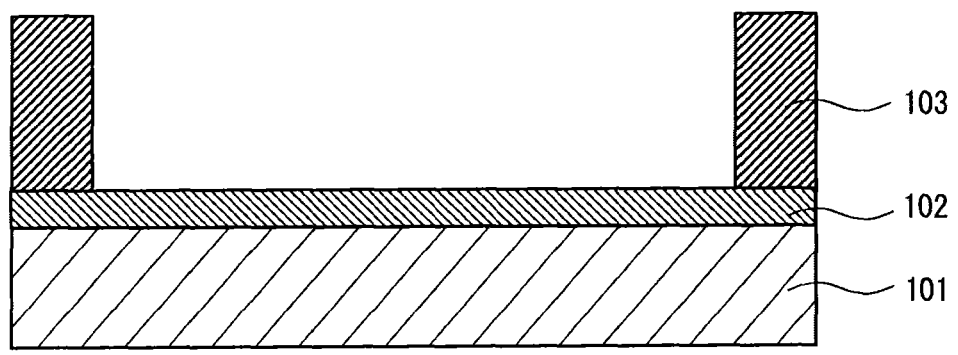
FIG. 2 shows a schematic cross sectional view illustrating one example of a state after forming a prepattern on the underlayer film in the pattern-forming method according to the embodiment of the present invention.

According to this step, a prepattern 103 is formed by using a composition for prepattern formation on the underlayer film 102 as shown in FIG. 2. The prepattern 103 enables a desired fine pattern to be formed through controlling a pattern configuration obtained by phase separation in the composition for pattern formation. More specifically, among the blocks included in the block copolymer (A) contained in the composition for pattern formation, a block having a higher affinity to a lateral face of the prepattern forms phases along the prepattern, whereas a block having a lower affinity forms phases at positions away from the prepattern. Accordingly, a desired pattern can be formed. In addition, according to the material, size, shape, etc. of the prepattern, the structure of the pattern formed through phase separation of the composition for pattern formation can be more minutely controlled. It is to be noted that the prepattern may be appropriately selected depending on the pattern intended to be finally formed, and, for example, a line-and-space pattern, a hole pattern, and the like may be employed.

As the method for forming the prepattern 103, those similar to well-known resist pattern-forming methods, and the like may be employed. In addition, a conventional composition for resist film formation may be used as the composition for prepattern formation. In addition, it is preferred that the prepattern has the group (b) on the surface thereof. Thus, a crosslinking reaction is caused between the prepattern and the directed self-assembling film, consequently, etching resistance of the pattern obtained from the directed self-assembling film is further improved. The composition for forming such a prepattern is exemplified by: a conventional composition for resist film formation in which the polymer contained as a principal component has the group (b); a conventional composition for resist film formation in which a water repellent polymer additive suitably used in liquid immersion lithography has the group (b); and the like.

In a specific method for formation of the prepattern 103, for example, a commercially available chemical amplification resist composition is coated on the underlayer film 102 to provide a resist film. Next, an exposure is carried out by irradiating a desired region of the resist film with a radioactive ray through a mask having a specific pattern. Examples of the radioactive ray include ultraviolet rays, far ultraviolet rays, X-rays, charged particle rays, and the like. Of these, far ultraviolet rays typified by ArF excimer laser beams and KrF excimer lasers are preferred, and ArF excimer laser beams are more preferred. Also, the exposure may employ a liquid immersion medium. Subsequently, post exposure baking (PEB) is carried out, followed by development using a developer solution such as an alkaline developer solution and an organic solvent, whereby a desired prepattern 103 can be formed.

It is to be noted that the surface of the prepattern 103 may be subjected to a hydrophobilization treatment or a hydrophilization treatment. In specific treatment methods, a hydrogenation treatment including exposing to hydrogen plasma for a certain time period, and the like may be adopted. An increase of the hydrophobicity or hydrophilicity of the surface of the prepattern 103 enables the directed self-assembly of the composition for pattern formation to be accelerated.

Directed Self-Assembling Film-Providing Step

Figure 3:
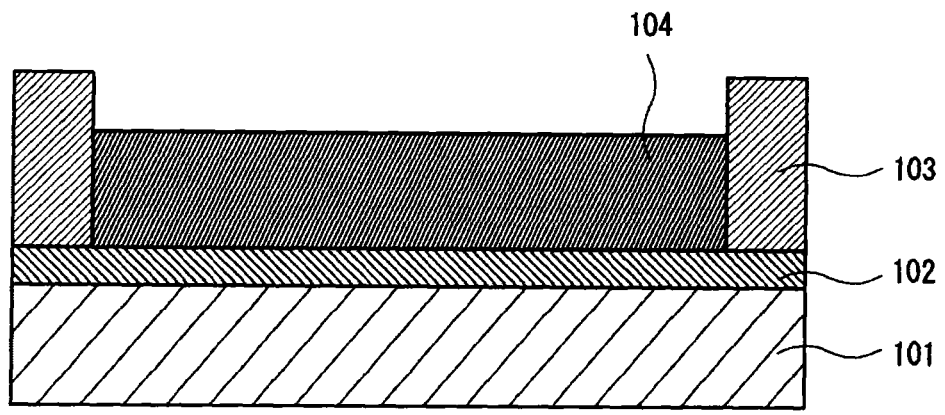
FIG. 3 shows a schematic cross sectional view illustrating one example of a state after applying a composition for pattern formation on a region surrounded by facing walls of the prepattern on the underlayer film in the pattern-forming method according to the embodiment of the present invention.
Figure 4:
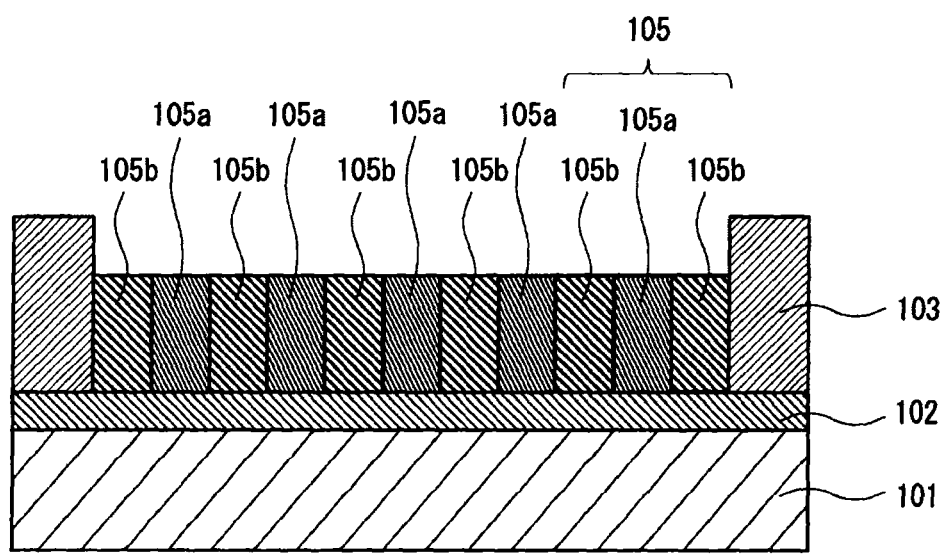
FIG. 4 shows a schematic cross sectional view illustrating one example of a state after providing a directed self-assembling film on a region surrounded by facing walls of the prepattern on the underlayer film in the pattern-forming method according to the embodiment of the present invention.

In this step, a directed self-assembling film having a phase separation structure is provided directly or indirectly on the substrate using the composition for pattern formation. In a case where the underlayer film and the prepattern are not used, the composition for pattern formation is directly coated on the substrate to give a coating film, whereby the directed self-assembling film having a phase separation structure is provided. Alternatively, in a case where the underlayer film and the prepattern are used, as shown in FIGS. 3 and 4, the composition for pattern formation is coated on a region surrounded by the prepattern 103 on the underlayer film 102 to give the coating film 104, and a directed self-assembling film 105 having a phase separation structure that includes boundaries substantially perpendicular to the substrate 101 is formed on the underlayer film 102 provided on the substrate 101.

More specifically, in a case where the polymer (A) is the block copolymer (A1) including two or more types of blocks incompatible with one another, coating the composition for pattern formation on the substrate, followed by annealing and the like allows blocks having identical properties to be assembled with one another to spontaneously form an ordered pattern, and thus enables directed self-assembly, as generally referred to, to be accelerated. Accordingly, a directed self-assembling film having a phase separation structure such as a sea-island structure, a cylinder structure, a co-interconnected or a lamellar structure can be formed. The phase separation structure preferably has phase boundaries substantially perpendicular to the substrate 101. In this step, the use of the composition for pattern formation according to the embodiment of the present invention enables occurrence of phase separation to be facilitated, and therefore a finer phase separation structure (microdomain structure) can be formed.

When the prepattern is included, the phase separation structure is preferably formed along the prepattern, and the boundaries formed by the phase separation are more preferably substantially parallel to a lateral face of the prepattern. For example, in a case where the prepattern 103 has a higher affinity to the polystyryl derivative block of the block copolymer (A), a phase (105*b*) of the polystyryl derivative block is linearly formed along the prepattern 103, and adjacent to the phase (105*b*), a phase (105*a*) of the poly ((meth)acrylic acid ester) block and the phase (105*b*) of the polystyryl derivative block are alternately arranged in this order to form a lamellar phase separation structure, or the like. It is to be noted that the phase separation structure formed in this step is configured with a plurality of phases, and the boundaries formed by these phases are, in general, substantially perpendicular to the substrate; however, the boundaries per se may not necessarily be clear. In addition, the resultant phase separation structure can be more strictly controlled by way of a ratio of the length of each block chain (polystyryl derivative block chain, poly((meth)acrylic acid ester) block chain, etc.) in molecules of the block copolymer (A), the length of the molecule of the block copolymer (A), the prepattern, the underlayer film and the like, and thus, a directed fine pattern can be obtained.

Although the procedure for providing the coating film 104 by coating the composition for pattern formation on a substrate is not particularly limited, for example, a procedure in which the composition for pattern formation employed is coated by spin coating etc., and the like may be involved. Accordingly, a space between facing walls of the prepattern 103 on the underlayer film 102 is filled with the composition for pattern formation.

The annealing process may include, for example, heating at a temperature of 80° C. to 400° C. in an oven, on a hot plate, etc., and the like. The annealing time period is typically 1 min to 120 min, and preferably 5 min to 90 min. The film thickness of the resulting directed self-assembling film 105 is preferably 0.1 nm to 500 nm, and more preferably 0.5 nm to 100 nm.

Furthermore, in light of promotion of the crosslinking reaction of the block copolymer (A), heating may be also carried out after completion of the annealing. The temperature of the reheating is preferably 100° C. to 300° C., and more preferably 120° C. to 230° C. The reheating time period is preferably 1 min to 120 min, and more preferably 1 min to 5 min. In addition, the reheating is preferably carried out in the air or in an inert gas, and more preferably carried out in a nitrogen gas.

Removing Step

Figure 5:
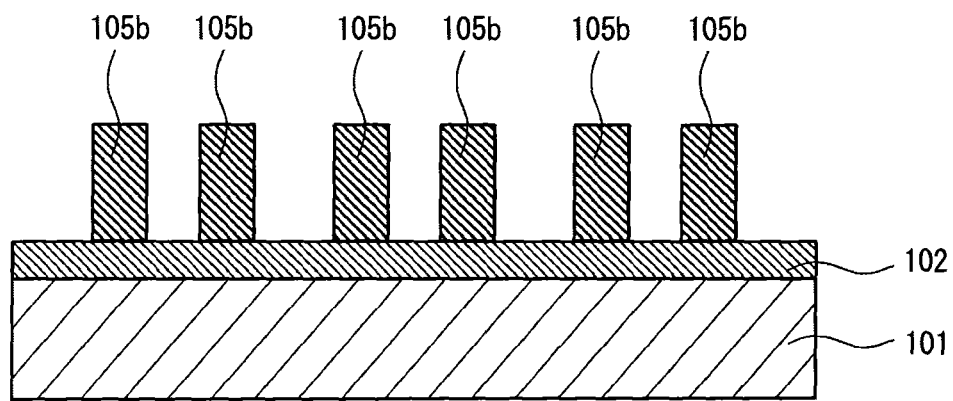
FIG. 5 shows a schematic cross sectional view illustrating one example of a state after removing a part of a plurality of phases of the directed self-assembling film and the prepattern in the pattern-forming method according to the embodiment of the present invention.

In this step, as shown in FIGS. 4 and 5, a part of phases 105*a* formed from the block in the phase separation structure included in the directed self-assembling film 105 are removed. Using the difference in the etching rate of each phase obtained through the phase separation by the directed self-assembly, the phases 105*a* formed from the poly((meth) acrylic acid ester) block can be removed by an etching treatment. A state after removing the phases 105*a* formed from the poly((meth)acrylic acid ester) block in the phase separation structure, as well as the prepattern 103 as described later is shown in FIG. 5. It is to be noted that before the etching treatment, irradiation with a radioactive ray may be conducted as needed. As the radioactive ray, when the phases to be removed by etching are the phases formed from the poly((meth)acrylic acid ester) block, a radioactive ray of 254 nm may be used. Since the irradiation with the radioactive ray results in decomposition of the phases formed from the poly((meth)acrylic acid ester) block, etching is more likely to be executed.

As the procedure for removing the phases 105a formed from the poly((meth)acrylic acid ester) block in the phase separation structure included in the directed self-assembling film 105, well-known procedures e.g., reactive ion etching (RIE) such as chemical dry etching and chemical wet etching; physical etching such as sputter etching and ion beam etching; and the like may be exemplified. Of these, reactive ion etching (RIE) is preferred, and chemical dry etching carried out by using a $CF_4$ gas, an $O_2$ gas or the like, and in particular, chemical wet etching (wet development) carried out by using an etching solution, i.e., an organic solvent, or a liquid such as hydrofluoric acid are more preferred. Examples of the organic solvent include: alkanes such as n-pentane, n-hexane and n-heptane; cycloalkanes such as cyclohexane, cycloheptane and cyclooctane; saturated carboxylic acid esters such as ethyl acetate, n-butyl acetate, i-butyl acetate and methyl propionate; ketones such as acetone, 2-butanone, 4-methyl-2-pentanone and 2-heptanone; alcohols such as methanol, ethanol, 1-propanol, 2-propanol and 4-methyl-2-pentanol; and the like. It is to be noted that these solvents may be used either alone, or two or more types thereof may be used in combination.

Prepattern-Removing Step

In this step, the prepattern 103 is removed, as shown in FIGS. 4 and 5. Removal of the prepattern 103 enables a finer and complicated pattern to be formed. It is to be noted that with respect to the procedure for removing the prepattern 103, the above description in connection with the procedure for removing a part of the phases 105a formed from the block in the phase separation structure may be employed. Also, this step may be carried out concomitantly with the removing step, or may be carried out before or after the removing step.

Substrate Pattern-Forming Step

In this step, using as a mask, a pattern constituted with the phase 105b formed from the polystyryl derivative block which are a part of the phases formed from the block in the residual phase separation structure after the removing step, the underlayer film and the substrate are etched to permit patterning. After completion of the patterning onto the substrate, the phases used as a mask are removed from the substrate by a dissolving treatment or the like, whereby a patterned substrate (pattern) can be finally obtained. As the procedure for the etching, a procedure similar to that in the removing step may be employed, and the etching gas and the etching solution may be appropriately selected in accordance with the materials of the underlayer film and the substrate. For example, in a case where the substrate is a silicon material, a gas mixture of chlorofluorocarbon-containing gas and $SF_4$, or the like may be used. Alternatively, in a case where the substrate is a metal film, a gas mixture of $BCl_3$ and $Cl_2$, or the like may be used. Note that the pattern obtained according to the pattern-forming method is suitably used for semiconductor elements and the like, and further the semiconductor elements are widely used for LED, solar cells, and the like.

EXAMPLES

Hereinafter, the present invention is explained in detail by way of Examples, but the present invention is not in any way limited to these Examples. Measuring methods of physical properties are shown below.

Weight Average Molecular Weight (Mw) and Number Average Molecular Weight (Mn)

The Mw and the Mn of the polymer were determined by gel permeation chromatography (GPC) using GPC columns ("G2000 HXL"×2, "G3000 HXL"×1, and "G4000 HXL"×1, manufactured by Tosoh Corporation) under the conditions involving the followings:

eluent: tetrahydrofuran (Wako Pure Chemical Industries, Ltd.);

flow rate: 1.0 mL/min;

sample concentration: 1.0% by mass;

amount of sample injected: 100 µL;

detector: differential refractometer; and standard substance: mono-dispersed polystyrene.

Synthesis of Block Copolymer (A)

Synthesis Example 1

Synthesis of Block Copolymer (A-1)

After a 500 mL flask as a reaction vessel was dried under reduced pressure, 200 g of tetrahydrofuran, which had been subjected to a dehydrating treatment by distillation, was charged into the flask under a nitrogen atmosphere, and cooled to −78° C. Thereafter, 1.09 mL (0.98 mmol) of a 1 N sec-butyllithium (sec-BuLi) solution in cyclohexane was charged, and 10.7 g (0.103 mmol) of styrene which had been subjected to a dehydrating treatment by distillation was added dropwise over 30 min. During this dropwise addition, the internal temperature of the reaction solution was carefully adjusted so as not to be −60° C. or higher. After the completion of the dropwise addition, the mixture was aged for 30 min. Then, 3.91 mL (1.96 mmol) of a 0.5 mol/L lithium chloride solution and 0.42 mL (2.94 mmol) of diphenylethylene were added thereto, and the mixture was sufficiently stirred. Thereto was added 10.7 g (0.103 mol) of methyl methacrylate dropwise over 30 min, which had been subjected to a dehydrating treatment by distillation, and the mixture was aged for 120 min. To this solution was added 0.152 g (1.00 mmol) of 4-vinylbenzyl chloride as a polymerization terminator to allow the polymerization end to be terminated, and the product was precipitated in methanol and the solvent was distilled off. A white solid obtained after the distillation of the solvent was diluted with methyl isobutyl ketone to prepare a 10% by mass solution. To this solution was added 500 g of a 1% by mass aqueous oxalic acid solution with stirring, and after the mixture was left to stand, the underlayer, i.e., an aqueous layer, was discarded. This operation was repeated three times to remove the lithium salt. Then, 500 g of ultra pure water was charged, the mixture was stirred, and then the underlayer, i.e., an aqueous layer, was discarded. This operation was repeated three times to remove oxalic acid. Thereafter, the solution was concentrated, and then the mixture was added dropwise to 2,000 g of methanol to permit deposition of a polymer. The resin obtained after vacuum filtration was washed twice with methanol, and then dried at 60° C. under reduced pressure to obtain 18.1 g of a white block copolymer (A-1).

The block copolymer (A-1) had an Mw of 41,000, an Mn of 37,200, and an Mw/Mn of 1.10. It is to be noted that the block copolymer (A-1) was a diblock copolymer including a polystyryl derivative block and a poly((meth)acrylic acid ester) block, and having a styrene group as the group (a), at the end. The vinyl group in styrene corresponds to the reactive group.

The synthesis method of the block copolymer (A-1) in Synthesis Example 1 above is as shown in the following scheme. In the scheme, n and m are an integer of 10 to 5,000.

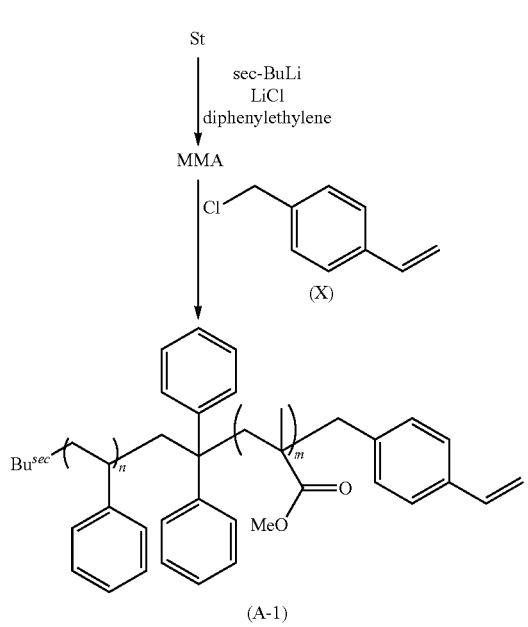

(A-1)

Synthesis Examples 2 to 5

Synthesis of Block Copolymers (A-2) to (CA-1)

Block copolymers (A-2) to (CA-1) were synthesized in a similar manner to Synthesis Example 1 except that the type of the polymerization terminator was as show in Table 1. Note that in the synthesis of (CA-1), a small amount of dehydrated methanol was used as the polymerization terminator, without a strict measurement of the amount.

TABLE 1

| (A) Component | Polymerization terminator type | amount g | mmol |
|---|---|---|---|
| Synthesis Example 1 A-1 | 4-vinylbenzyl chloride | 0.152 | 1 |
| Synthesis Example 2 A-2 | chloroethyl vinyl ether | 0.106 | 1 |
| Synthesis Example 3 A-3 | allyl bromide | 0.120 | 1 |
| Synthesis Example 4 A-4 | 3-ethyl-3-chloromethyloxetane | 0.135 | 1 |
| Synthesis Example 5 CA-1 | dehydrated methanol | — | — |

Among the polymerization terminators shown in Table 1, 4-vinylbenzyl chloride, chloroethyl vinyl ether, allyl bromide and 3-ethyl-3-chloromethyloxetane correspond to the compound (X).

Since the compound (X) was not used as the polymerization terminator in Synthesis Example 5, the synthesis method of the block copolymer (CA-1) follows the scheme shown below. In the scheme, n and m are an integer of 10 to 5,000.

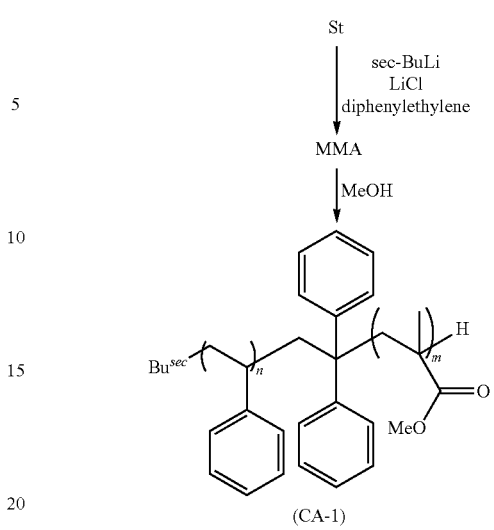

(CA-1)

The Mw, the Mn, the Mw/Mn and the yield of the block copolymers (A-1) to (A-4) and (CA-1) are shown in Table 2.

TABLE 2

| | (A) Component | Mw | Mn | Mw/Mn | Yield (%) |
|---|---|---|---|---|---|
| Synthesis Example 1 | A-1 | 41,000 | 37,200 | 1.10 | 84 |
| Synthesis Example 2 | A-2 | 41,300 | 38,500 | 1.07 | 86 |
| Synthesis Example 3 | A-3 | 41,400 | 39,500 | 1.05 | 86 |
| Synthesis Example 4 | A-4 | 40,300 | 38,200 | 1.05 | 82 |
| Synthesis Example 5 | CA-1 | 39,000 | 36,500 | 1.07 | 87 |

Preparation of Composition for Pattern Formation
Compounds used in the preparation of the compositions for pattern formation are shown below.
(B) Solvent
B-1: propylene glycol monomethyl ether acetate
(C) Reaction Accelerator
C-1: triphenylsulfonium 2-(norbornan-2-yl)-1,1,2,2-tetrafluoroethane-1-sulfonate (a compound represented by the following formula (C-1))

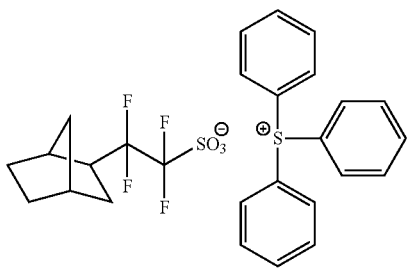

(D) Crosslinkable Compound
D-1: 1,6-hexanedithiol (a compound represented by the following formula (D-1))

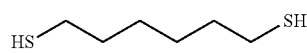

Examples 1 to 8, and Comparative Example 1

(A-1) in an amount of 10 parts by mass as the block copolymer (A) and 5 parts by mass of (C-1) as the reaction accelerator (C) were dissolved in 985 parts by mass of (B-1) as the solvent (B) to give a 1% by mass solution. This solution was filtered through a membrane filter having a pore size of 200 nm to prepare a composition for pattern formation (S-1). In a similar manner, compositions for pattern formation (S-2) to (S-8) and (CS-1) were prepared using the polymer and the like shown in Table 3. Using these compositions for pattern formation, patterns were formed according to the following method.

tion). Subsequently, heating at 250° C. for 10 min allowed phase separation to occur, whereby a microdomain structure was formed. Thereafter, dry etching with $O_2$ plasma using a plasma etching apparatus ("Tactras", available from Tokyo Electron Limited) was carried out to form a pattern with 30-nm pitch.

Evaluations

The pattern formed as described above was observed using a line-width measurement SEM ("S-4800", available from Hitachi, Ltd.). Evaluation methods are shown below.

With respect to the microphase-split ability, the evaluation was made as: "favorable (A)" when a phase separation

TABLE 3

| Composition for pattern formation | (A) Component type | content (parts by mass) | (B) Solvent type | content (parts by mass) | (C) Reaction accelerator type | content (parts by mass) | (D) Crosslinkable compound type | content (parts by mass) |
|---|---|---|---|---|---|---|---|---|
| Example 1 | S-1 | A-1 | 10 | B-1 | 985 | C-1 | 5 | — | — |
| Example 2 | S-2 | A-2 | 10 | B-1 | 985 | C-1 | 5 | — | — |
| Example 3 | S-3 | A-3 | 10 | B-1 | 985 | C-1 | 5 | — | — |
| Example 4 | S-4 | A-4 | 10 | B-1 | 985 | C-1 | 5 | — | — |
| Example 5 | S-5 | A-2 | 10 | B-1 | 985 | — | — | D-1 | 5 |
| Example 6 | S-6 | A-3 | 10 | B-1 | 985 | — | — | D-1 | 5 |
| Example 7 | S-7 | A-1 | 10 | B-1 | 990 | — | — | — | — |
| Example 8 | S-8 | A-3 | 10 | B-1 | 990 | — | — | — | — |
| Comparative Example 1 | CS-1 | CA-1 | 10 | B-1 | 990 | — | — | — | — |

Synthesis of Composition for Forming Underlayer Film

To a flask equipped with a condenser and a stirrer were charged 100 parts by mass of methyl ethyl ketone, and nitrogen substitution was carried out. After heating to 80° C., a mixture of 100 parts by mass of methyl ethyl ketone, 51 parts by mass (0.49 mol) of styrene, 49 parts by mass (0.49 mol) of methyl methacrylate and 5 parts by mass of mercaptoundecene was mixed with a mixture of 5 parts by mass of 2,2'-azobis(2-propionitrile) and methyl ethyl ketone. Purification by precipitation was carried out in 3 L of methanol, whereby residual monomers, the initiator and the like were removed to give a solid content. The solid content had an Mw of 7,201, an Mn of 5,114 and an Mw/Mn of 1.41. Next, the solid content was dissolved in propylene glycol monomethyl ether acetate to give a 10% by mass solution. This solution in an amount of 150 parts by mass was dissolved in 9,850 parts by mass of propylene glycol monomethyl ether acetate, and the solution was filtered through a membrane filter having a pore size of 0.1 μm to obtain a composition for forming an underlayer film.

Pattern-Forming Method

The composition for forming an underlayer film was coated on a 12-inch silicon wafer using a spin coater ("CLEAN TRACK ACT12", available from Tokyo Electron Limited) to provide a coating film having a film thickness of 5 nm. This coating film was subjected to an exposure using an ArF Immersion Scanner ("NSR S610C", available from NIKON Corporation). Thereafter, baking was carried out at 220° C. for 120 sec to form an underlayer film having a film thickness of 10 nm.

Next, each composition for pattern formation was coated on the underlayer film so as to have a thickness of 30 nm, and an exposure was carried out using the ArF Immersion Scanner ("NSR S610C", available from NIKON Corporastructure was formed; and "unfavorable (B)" when a phase separation structure was not formed.

With respect to the fingerprint defect, the evaluation was made as: "favorable (A)" when clear phase separation was ascertained and a defect was not found; and "unfavorable (B)" when a portion in which unclear phase separation was present and/or a defect was found.

With respect to the rectangularity, a cross-sectional shape of the pattern was similarly observed, and the evaluation was made as: "favorable (A)" when the pattern was recognized to be rectangular; and "B" when the pattern was not recognized to be rectangular.

With respect to the etching resistance, after the dry etching, a part of the substrate and pattern was cut away, and the evaluation was made as: "favorable (A)" when the relief structure indicated by the cross section was clear; and "unfavorable (B)" when pattern collapse and/or etching residues were found.

The results of the evaluations of microphase-split ability, fingerprint defect, rectangularity and etching resistance are shown in Table 4.

TABLE 4

| | Composition for pattern formation | Microphase-split ability | Fingerprint defect | Rectangularity | Etching resistance |
|---|---|---|---|---|---|
| Example 1 | S-1 | A | A | A | A |
| Example 2 | S-2 | A | A | A | A |
| Example 3 | S-3 | A | A | B | B |
| Example 4 | S-4 | A | A | A | A |
| Example 5 | S-5 | A | A | A | A |
| Example 6 | S-6 | A | A | A | A |

TABLE 4-continued

| | Composition for pattern formation | Microphase-split ability | Finger-print defect | Rectan-gularity | Etching resistance |
|---|---|---|---|---|---|
| Example 7 | S-7 | A | A | B | B |
| Example 8 | S-8 | A | B | B | B |
| Comparative Example 1 | CS-1 | A | B | B | B |

As shown in Table 4, when the compositions for pattern formation of Examples were used, the fingerprint defect was not found, and defects of the phase separation structure were inhibited. In addition, the rectangularity of the cross-sectional shape of the pattern and the etching resistance were also superior. On the other hand, when the composition for pattern formation of Comparative Example was used, the fingerprint defect occurred, and rectangularity of the cross-sectional shape of the pattern and etching resistance were also inferior.

The composition for pattern formation and the pattern-forming method according to the embodiments of the present invention lead to superior inhibitory ability of defects in the phase separation structure, rectangularity of the cross-sectional shape of the pattern configuration and etching resistance. Therefore, these can be suitably used for pattern formation in manufacture of semiconductor devices, and the like in which further progress of miniaturization is expected in the future.

Obviously, numerous modifications and variations of the present invention are possible in light of the above teachings. It is therefore to be understood that within the scope of the appended claims, the invention may be practiced otherwise than as specifically described herein.

What is claimed is:

1. A pattern-forming method comprising:
    applying a pattern-forming composition directly or indirectly on a substrate to provide a directed self-assembling film, the directed self-assembling film comprising a phase separation structure which comprises a plurality of phases; and
    removing a part of the plurality of phases of the directed self-assembling film,
    wherein the pattern-forming composition comprises:
        a block copolymer comprising an end group comprising a reactive group on at least one end of a main chain of the block copolymer; and
        a solvent, and
    wherein the reactive group is an ethylenic carbon-carbon double bond-containing group, a carbon-carbon triple bond-containing group, an oxetanyl group, or a combination thereof.

2. The pattern-forming method according to claim 1, further comprising heating during or after providing the directed self-assembling film.

3. The pattern-forming method according to claim 1, further comprising before providing the directed self-assembling film:
    providing an underlayer film on the substrate; and
    forming a prepattern on the underlayer film such that a region which is compartmentalized by the prepattern is formed on the underlayer film, wherein in providing the directed self-assembling film, the directed self-assembling film is provided on the region.

4. The pattern-forming method according to claim 3, wherein at least one of the underlayer film and the prepattern comprises on a surface thereof, a group capable of reacting with the reactive group.

5. The pattern-forming method according to claim 1, wherein the pattern obtained is a line-and-space pattern or a hole pattern.

6. The pattern-forming method according to claim 1, wherein the block copolymer is obtained by using as a polymerization terminator of block copolymerization, a compound comprising the reactive group and a carbon-halogen bond.

7. The pattern-forming method according to claim 1, wherein the end group is attached to the block copolymer on only one end of the block copolymer.

8. The pattern-forming method according to claim 1, wherein the block copolymer comprises a poly((meth)acrylic acid ester) block comprising a (meth)acrylic acid ester unit.

9. The pattern-forming method according to claim 8, wherein the block copolymer further comprises a polystyryl derivative block comprising a styryl derivative unit.

10. The pattern-forming method according to claim 1, wherein the block copolymer is a diblock polymer or a triblock polymer.

11. The pattern-forming method according to claim 1, wherein the pattern-forming composition further comprises a reaction accelerator or a crosslinkable compound.

12. The pattern-forming method according to claim 1, wherein the end group is a group obtained by binding the reactive group to a divalent organic group.

13. The pattern-forming method according to claim 12, wherein the divalent organic group is a substituted or unsubstituted divalent hydrocarbon group, or a group comprising a hetero atom-containing group between two carbon atoms of the substituted or unsubstituted divalent hydrocarbon group.

14. The pattern-forming method according to claim 13, wherein the hetero atom-containing group is —SO—, —SO$_2$—, —SO$_2$O—, —SO$_3$—, —CO—, —COO—, —COS—, —CONH—, —OCOO—, —OCOS—, —OCONH—, —SCONH—, or —SCSNH—.

15. The pattern-forming method according to claim 12, wherein the divalent organic group is a divalent hydrocarbon group which is unsubstituted or substituted with a halogen atom, a hydroxy group, a carboxy group, a nitro group or a cyano group, or a group comprising a hetero atom-containing group between two carbon atoms of the divalent hydrocarbon group.

16. The pattern-forming method according to claim 15, wherein the hetero atom-containing group is —SO—, —SO$_2$—, —SO$_2$O—, —SO$_3$—, —CO—, —COO—, —COS—, —CONH—, —OCOO—, —OCOS—, —OCONH—, —SCONH—, or —SCSNH—.

17. The pattern-forming method according to claim 1, wherein the reactive group is a vinyl group, a vinyl ether group, an oxetanyl group, or a combination thereof.

* * * * *